(12) United States Patent
Uh et al.

(10) Patent No.: US 7,514,199 B2
(45) Date of Patent: Apr. 7, 2009

(54) HARDMASK COMPOSITIONS FOR RESIST UNDERLAYER FILM AND METHOD FOR PRODUCING SEMICONDUCTOR INTEGRATED CIRCUIT DEVICE USING THE SAME

(75) Inventors: Dong Seon Uh, Seoul-si (KR); Chang Il Oh, Kyeonggi-Do (KR); Do Hyeon Kim, Kyeonggi-Do (KR); Hui Chan Yun, Kyeongsangnam-do (KR); Jin Kuk Lee, Kyeonggi-Do (KR); Irina Nam, Kyeonggi-do (KR); Jong Seob Kim, Daejeon-si (KR)

(73) Assignee: Cheil Industries, Inc. (KR)

( * ) Notice: Subject to any disclaimer, the term of this patent is extended or adjusted under 35 U.S.C. 154(b) by 277 days.

(21) Appl. No.: 11/507,701

(22) Filed: Aug. 22, 2006

(65) Prior Publication Data

US 2007/0148586 A1    Jun. 28, 2007

(30) Foreign Application Priority Data

Dec. 26, 2005    (KR)    ............... 10-2005-0130010
Dec. 26, 2005    (KR)    ............... 10-2005-0130013
Dec. 26, 2005    (KR)    ............... 10-2005-0130016
Dec. 26, 2005    (KR)    ............... 10-2005-0130022

(51) Int. Cl.
*G03F 7/004*    (2006.01)
*G03F 7/30*    (2006.01)

(52) U.S. Cl. ............... 430/270.1; 430/272.1; 430/311; 430/905; 430/910

(58) Field of Classification Search ............ 430/270.1, 430/272.1, 311, 905, 910
See application file for complete search history.

(56) References Cited

U.S. PATENT DOCUMENTS 6,531,260 B2 * 3/2003 Iwasawa et al. .......... 430/270.1
6,899,991 B2 * 5/2005 Kato et al. ............... 430/270.1
6,908,722 B2 * 6/2005 Ebata et al. .............. 430/270.1
2007/0148974 A1    6/2007 Uh et al.
2007/0212886 A1 * 9/2007 Uh et al. .................... 438/706

* cited by examiner

*Primary Examiner*—John S Chu
(74) *Attorney, Agent, or Firm*—Myers Bigel Sibley & Sajovec, P.A.

(57) ABSTRACT

Provided herein are hardmask compositions for resist underlayer films, wherein in some embodiments, the hardmask compositions include
  (a) a first polymer prepared by the reaction of a compound of Formula 1

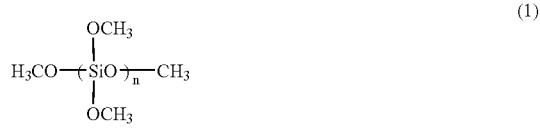

(1)

wherein n is a number of 3 to 20, with a compound of Formula 2

$(R)_m\text{—Si—}(OCH_3)_{4\text{-}m}$    (2)

wherein R is a monovalent organic group and m is 0, 1 or 2;
  (b) a second polymer that includes at least one of the structures represented by Formulae 3-6;
  (c) an acid or base catalyst; and
  (d) an organic solvent.

Further provided herein are methods for producing a semiconductor integrated circuit device using a hardmask composition according to an embodiment of the present invention. In addition, provided herein are semiconductor integrated circuit devices produced by a method embodiment of the invention.

49 Claims, No Drawings

HARDMASK COMPOSITIONS FOR RESIST UNDERLAYER FILM AND METHOD FOR PRODUCING SEMICONDUCTOR INTEGRATED CIRCUIT DEVICE USING THE SAME

CLAIM OF PRIORITY

This application claims priority under 35 U.S.C. §119 to Korean Application Nos. 2005-0130010, 2005-0130013, 2005-0130016 and 2005-0130022, all filed on Dec. 26, 2005, the contents of which are herein incorporated by reference in their entirety.

FIELD OF THE INVENTION

The present invention relates to hardmask compositions for a resist underlayer film and to methods for the production of a semiconductor integrated circuit device using the hardmask compositions.

BACKGROUND OF THE INVENTION

For better resolution in lithographic processes, an antireflective coating (ARC) material may be used to minimize the reflectivity between an imaging layer, such as a photosensitive resist layer, and a substrate. However, because the resist layer often has a composition similar that of the ARC material, the ARC material may provide poor etch selectivity relative to the imaging layer. Accordingly, since large portions of the imaging layer may be removed during etching of the ARC material after patterning, additional patterning may be required in a subsequent etching step.

However, in some lithographic imaging processes, the resist material may not provide sufficient etch resistance to effectively transfer the desired pattern to a layer underlying the resist material. In actual applications, a so-called hardmask for a resist underlayer film may be applied as an intermediate layer between a patterned resist and the substrate to be patterned. For example, when an ultrathin-film resist material is used, the substrate to be etched is thick, a substantial etching depth is required, and/or the use of a particular etchant is required for a specific substrate, a hardmask for the resist underlayer may be desirable. The hardmask for a resist underlayer film may receive the pattern from the patterned resist layer and transfer the pattern to the substrate. The hardmask for a resist underlayer film should be able to withstand the etching processes needed to transfer the pattern to the underlying material.

For example, when a substrate, such as a silicon oxide film, is processed, a resist pattern may be used as a mask. At this time, the resist may be micropatterned but with a decreased thickness. Thus, since the masking properties of the resist may be insufficient, processing of the substrate may result in damage to the substrate. Therefore, a process may be employed whereby a resist pattern is first transferred to an underlayer film for the processing of the substrate, followed by dry etching of the substrate using the underlayer film as a mask. The underlayer film for the processing of the substrate refers to a film that is formed under an antireflective film and functions as an underlayer antireflective film. In this process, the etching rate of the resist is similar to that of the underlayer film for the processing of the substrate. Thus, it may be necessary to form a mask for processing the underlayer film between the resist and the underlayer film. As a consequence, a multilayer film consisting of the underlayer film for the processing of the substrate, the mask for processing the underlayer film and the resist may be formed on the substrate.

The refractive index and the absorbance of the mask for processing the underlayer film are varied depending on the refractive index, absorbance and thickness of the underlying underlayer film for the processing of the substrate.

It is desirable that a mask for processing an underlayer film meets the following criteria: i) the mask should enable formation of a resist pattern with minimal hemming; ii) the mask should adhere well to the resist; and iii) the mask should have sufficient masking properties when the underlayer film for the processing of a substrate is processed. It is further desirable that a hardmask for processing an underlayer film exhibit high etch selectivity and be sufficiently resistant to multiple etchings. In addition, the hardmask should minimize the reflectivity between a resist and an underlying layer. Thus, the refractive index and absorbance of the mask for processing an underlayer film should be optimized to effectively utilize antireflective properties and ensure a lithographic process margin. To date, mask materials capable of meeting all these requirements have not yet been developed.

SUMMARY OF THE INVENTION

According to some embodiments of the present invention, hardmask compositions for a resist underlayer film include (a) a first polymer prepared by the reaction of a compound of Formula 1

wherein n is a number of 3 to 20, with a compound of Formula 2

wherein R is a monovalent organic group and m is 0, 1 or 2;

(b) a second polymer that includes a structure represented by Formula 3:

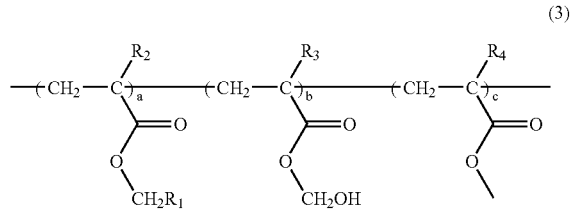

wherein $R_1$ is aryl; $R_2$, $R_3$ and $R_4$ are each independently hydrogen, alkyl, aryl or allyl; and a, b and c are each independently a positive integer;

(c) an acid or base catalyst; and (d) an organic solvent.

According to some embodiments of the present invention, hardmask compositions for a resist underlayer film include (a) a first polymer prepared by the reaction of a compound of Formula 1

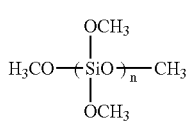

(1)

wherein n is a number of 3 to 20, with a compound of Formula 2

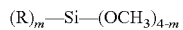

(2)

wherein R is a monovalent organic group and m is 0, 1 or 2;

(b) a second polymer that includes a structure represented by Formula 4

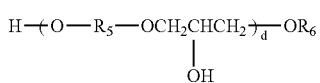

(4)

wherein $R_5$ is an arylene; $R_6$ is hydroxyaryl, epoxy-substituted aryl, arylalkyl or an arylcarbonyl; and d is a positive integer;

(c) an acid or base catalyst; and (d) an organic solvent.

According to some embodiments of the present invention, hardmask compositions for a resist underlayer film include (a) a first polymer prepared by the reaction of a compound of Formula 1

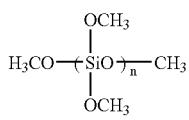

(1)

wherein n is a number of 3 to 20, with a compound of Formula 2

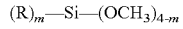

(2)

wherein R is a monovalent organic group and m is 0, 1 or 2;

(b) a second polymer that includes a structure represented by Formula 5

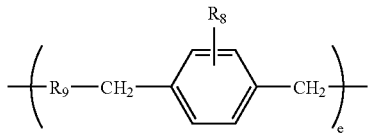

(5)

wherein $R_8$ is hydrogen, alkyl, aryl or allyl; $R_9$ is hydroxyarylene and e is a positive integer;

(c) an acid or base catalyst; and (d) an organic solvent.

According to some embodiments of the present invention, hardmask compositions for a resist underlayer film include (a) a first polymer prepared by the reaction of a compound of Formula 1

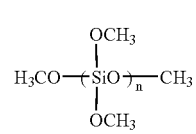

(1)

wherein n is a number of 3 to 20, with a compound of Formula 2

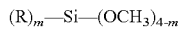

(2)

wherein R is a monovalent organic group and m is 0, 1 or 2;

(b) a second polymer that includes a structure represented by Formula 6

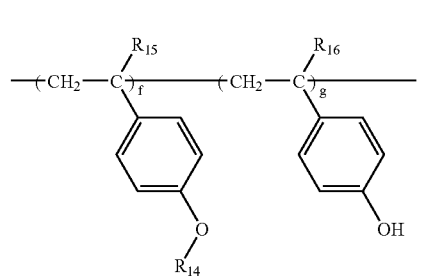

(6)

wherein $R_{14}$ is aryl; $R_{15}$ and $R_{16}$ are each independently hydrogen, alkyl, aryl or allyl; and f and g are each independently a positive integer;

(c) an acid or base catalyst; and (d) an organic solvent.

According to some embodiments of the present invention, hardmask compositions for a resist underlayer film include (a) a first polymer including about 10 to about 99 mol %, based on the total moles of silicon-containing monomeric units, of the monomeric unit of Formula 7 below:

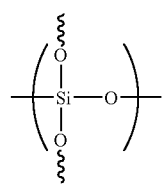

(7)

and about 1 to about 90 mol %, based on the total moles of silicon-containing monomeric units, of at least one monomeric unit selected from the monomeric units of Formulae 8 and 9 below:

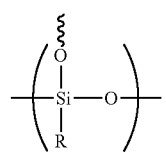

(8)

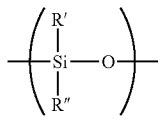

(9)

wherein R, R' and R" are each independently a monovalent organic group;

(b) a second polymer that includes at least one of the structures represented by Formulae 3 to 6;

(c) an acid or base catalyst; and (d) an organic solvent.

Embodiments of the present invention further include methods for producing a semiconductor integrated circuit device, including the steps of:

(a) providing a material layer on a substrate;

(b) forming a hardmask layer on the material layer wherein the hardmask layer is composed of an organic material;

(c) forming an antireflective hardmask layer using the hardmask composition according to an embodiment of the invention for a resist underlayer film on the material layer;

(d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

Embodiments of the invention further include a semiconductor integrated circuit device produced by a method embodiment of the invention.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein:

The terms "alkyl" and "alkylene" refer to a monovalent or bivalent (respectively) straight, branched, or cyclic hydrocarbon radical having from 1 to 12 carbon atoms. In some embodiments, the alkyl(ene) may be a "lower alkyl(ene)" wherein the alkyl(ene) group has 1 to 4 hydrocarbons. For example, lower alkyl may include methyl, ethyl, propyl, isopropyl, butyl, and iso-butyl, while lower alkylene may include methylene (—CH$_2$—), ethylene (—CH$_2$CH$_2$—), propylene (—CH$_2$CH$_2$CH$_2$—), isopropylene (—CH (CH$_3$)$_2$—), butylene (—CH$_2$CH$_2$CH$_2$CH$_2$—), iso-butylene (—C(CH$_3$)$_2$CH$_2$—) and the like. The alkyl(ene) may be unsubstituted or substituted, for example, with methyl, phenyl or hydroxyl groups.

The terms "aryl" and "arylene" refer to a monovalent or bivalent (respectively) group including an aromatic radical and may optionally include 1 to 3 additional rings (e.g., cycloalkyl) fused thereto. The aryl(ene) rings may be unsubstituted or substituted, for example, with methyl, phenyl or hydroxyl groups. Exemplary aryl(ene) groups may include: phenyl(ene), naphthyl(idene), anthracenyl(idene). Other arylene groups include

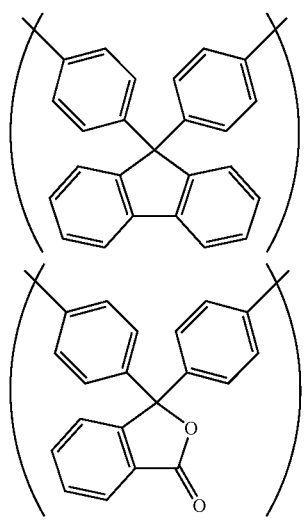

The terms "hydroxyaryl(ene)" refers to an aryl(ene) group, as defined herein, substituted with a hydroxy group. The hydroxy group may be attached at any portion of the aryl(ene) group. Exemplary hydroxyarylene groups include hydroxyphenylene and hydroxynapthylidene (shown below)

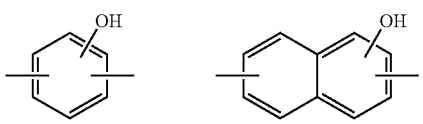

and an arylene group of the structure

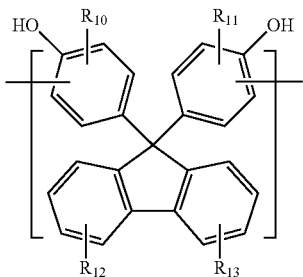

wherein $R_{10}$ and $R_{11}$ are each independently hydrogen, hydroxyl, $C_{1-10}$ alkyl, $C_{6-10}$ aryl, allyl or halogen, and $R_{12}$ and $R_{13}$ are each independently hydrogen, a crosslinking functionality or a chromophore.

The term "epoxy-substituted aryl(ene)" refers to an aryl (ene) group, as defined herein, substituted with a group containing an epoxy moeity. The term "epoxy" refers to a functional group wherein an oxygen atom is directly attached to two carbon atoms already forming part of a ring system or to two carbon atoms of a chain. An exemplary epoxy-substituted aryl include the

wherein $R_5$ is an aryl group.

The term "arylalkyl" refers to an alkyl group, as defined herein, substituted with an aryl group, as defined herein. Exemplary arylalkyl include phenylmethyl, naphthylmethyl and anthracenylmethyl.

The term "arylcarbonyl" refers to a —C(═O)-aryl radical, wherein aryl is as defined herein. Exemplary arylcarbonyl include phenylcarbonyl, naphthylcarbonyl and anthracenylcarbonyl.

The term "allyl" refers to a —CH$_2$—CH═CH$_2$ radical.

The term "crosslinking functionality" refers to a functional group of a polymer of an embodiment of the invention that is capable of reacting with another crosslinking functionality or a crosslinking agent added to the hardmask composition to crosslink the polymer(s). Exemplary crosslinking functionalities may include hydroxyl and epoxide groups.

The term "chromophore" refers to any suitable chromophore. Exemplary chromophores include phenyl, chrysenyl, pyrenyl, fluoranthrenyl, anthronyl, benzophenonyl, thioxanthonyl, anthracenyl, and anthracenyl derivatives that act as chromophores.

The term "$C_x$," wherein x is an integer, will be used herein with reference to alkyl and aryl groups to denote an alkyl or aryl having x number of carbon atoms. Thus, for example, a $C_5$ alkyl refers to any alkyl having five carbon atoms, and a $C_6$-$C_{10}$ aryl refers to any aryl having from 6 to 10 carbon atoms.

According to some embodiments of the present invention, hardmask compositions for a resist underlayer film include (a) a first polymer prepared by the reaction of a compound of Formula 1

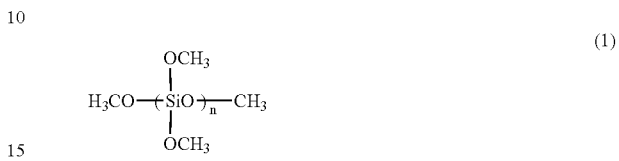

wherein n is a number of 3 to 20, with a compound of Formula 2

$$(R)_m—Si—(OCH_3)_{4-m} \quad (2)$$

wherein R is a monovalent organic group and m is 0, 1 or 2;

(b) a second polymer that includes a structure represented by Formula 3

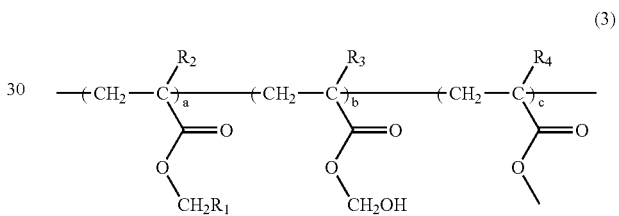

wherein $R_1$ is aryl; $R_2$, $R_3$ and $R_4$ are each independently hydrogen, alkyl, aryl or allyl; and a, b and c are each independently a positive integer;

(c) an acid or base catalyst; and (d) an organic solvent.

In particular embodiments of the invention, $R_1$ is phenyl, naphthyl or anthracenyl; $R_2$, $R_3$ and $R_4$ are each independently hydrogen, $C_{1-10}$ alkyl, $C_{6-10}$ aryl or allyl; and a, b and c are each independently an integer from 1 to 60.

For the compound represented by Formula 3, the monomeric units defined by subscripts a, b and c may be present in any combination and in any order. Thus, for example, the compound represented by Formula 3 may be a random or block terpolymer. In some embodiments, the compound of Formula 3 is preferably an anthracene-containing acrylic terpolymer. In addition, a naphthalene ring present in the compound of Formula 3 may have an absorption spectrum in the DUV region and may allow the hardmask composition to have optimum refractive index and absorption at a particular thickness according to the amount of the compound of Formula 3 added.

According to some embodiments of the present inventionm, hardmask compositions for a resist underlayer film include (a) a first polymer prepared by the reaction of a compound of Formula 1

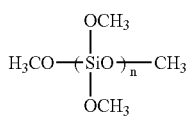 (1)

wherein n is a number of 3 to 20, with a compound of Formula 2

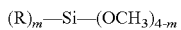 (2)

wherein R is a monovalent organic group and m is 0, 1 or 2;

(b) a second polymer that includes a structure represented by Formula 4

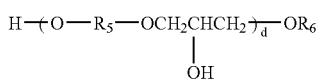 (4)

wherein $R_5$ is an arylene; $R_6$ is hydroxyaryl, epoxy-substituted aryl, arylalkyl or an arylcarbonyl; and d is a positive integer;

(c) an acid or base catalyst; and (d) an organic solvent.

In particular embodiments of the invention, $R_5$ is one of the following two arylene groups

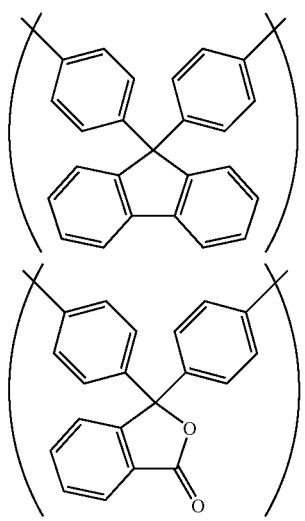

$R_6$ is $R_5$OH,

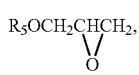

$CH_2R_7$ or $C(=O)R_7$, wherein $R_7$ is anthracenyl, naphthyl or phenyl; and d is an integer from 3 to 20. Thus, for the $R_6$ group of $R_5$OH, the hydroxy group may be attached to any suitable portion of the $R_5$ arylene group, and for the $R_6$ group of

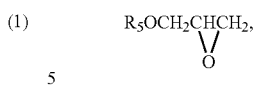

the epoxide group may be attached to any suitable portion of the $R_5$ arylene group. For example, $R_6$ may be one of the following groups:

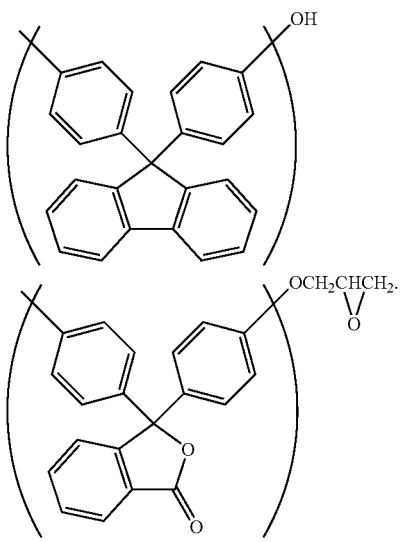

According to some embodiments of the present invention, hardmask compositions for a resist underlayer film include (a) a first polymer prepared by the reaction of a compound of Formula 1

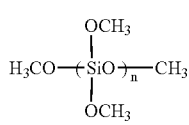 (1)

wherein n is a number of 3 to 20, with a compound of Formula 2

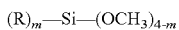 (2)

wherein R is a monovalent organic group and m is 0, 1 or 2;

(b) a second polymer that includes a structure represented by Formula 5

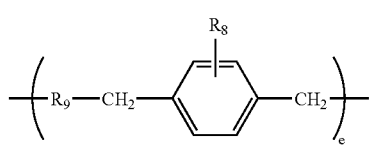 (5)

wherein $R_8$ is hydrogen, alkyl, aryl or allyl; $R_9$ is hydroxyarylene and e is a positive integer;

(c) an acid or base catalyst; and (d) an organic solvent.

In particular embodiments of the invention, $R_8$ is hydrogen, $C_{1-10}$ alkyl, $C_{6-10}$ aryl or allyl, $R_9$ is hydroxynapthylidene, hydroxyphenylene or a compound having the structure of

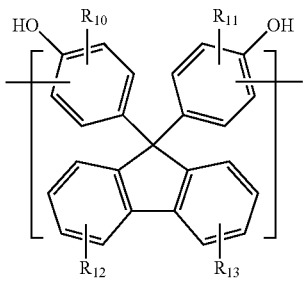

wherein $R_{10}$ and $R_{11}$ are each independently hydrogen, hydroxyl, $C_{1-10}$ alkyl, $C_{6-10}$ aryl, allyl or halogen, and $R_{12}$ and $R_{13}$ are each independently hydrogen, a crosslinking functionality or a chromophore; and e is an integer from 1 to 190.

According to some embodiments of the present invention, hardmask compositions for a resist underlayer film include (a) a first polymer prepared by the reaction of a compound of Formula 1

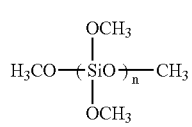
(1)

wherein n is a number of 3 to 20, with a compound of Formula 2

(2)

wherein R is a monovalent organic group and m is 0, 1 or 2;

(b) a second polymer that includes a structure represented by Formula 6

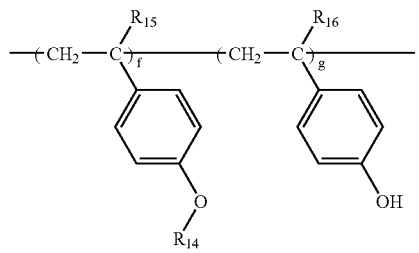
(6)

wherein $R_{14}$ is aryl; $R_{15}$ and $R_{16}$ are each independently hydrogen, alkyl, aryl or allyl; and f and g are each independently a positive integer;

(c) an acid or base catalyst; and (d) an organic solvent.

For the compound represented by Formula 6, the monomeric units defined by subscripts f and g may be present in any combination and in any order. Thus, for example, the compound represented by Formula 6 may be a random or block copolymer. In particular embodiments of the invention, $R_{14}$ is phenyl, naphthyl or anthracenyl; $R_{15}$ and $R_{16}$ are each independently hydrogen, $C_{1-10}$ alkyl, $C_{6-10}$ aryl or allyl; and f and g are each independently an integer from 1 to 60.

Silicates of Formula 1, including, for example, MS51 ($M_w$=600) or MS56 ($M_w$=1,200) available from Mitsubishi, may be hydrolyzed and condensed with the compound of Formula 2 to prepare the first polymer of a hardmask composition according to the present invention. For the compound of Formula 2, R may be any monovalent radical, but in some embodiments, R is an alkyl (e.g., methyl, ethyl, propyl, and the like) or aryl group (e.g., phenyl, naphthyl, anthracenyl, and the like). By controlling the silicon content in the compound of Formula 1, an optimal etch selectivity between an overlying photoresist layer and an underlying hardmask layer composed of an organic material may be achieved.

In some embodiments, the compound of Formula 2 is phenyltrimethoxysilane. By taking advantage of the fact that the phenyl group contained in the compound of Formula 2 has an absorption spectrum in the DUV region, a highly antireflective material may be provided. At the same time, by controlling the content of the phenyl and methyl groups of a compound of Formula 2, a hardmask composition having desired absorbance and refractive index at a particular wavelength may be provided.

In some embodiments of the present invention, the first polymer includes at least one of the structures represented by Formulae 10-14:

(10)

(11)

(12)

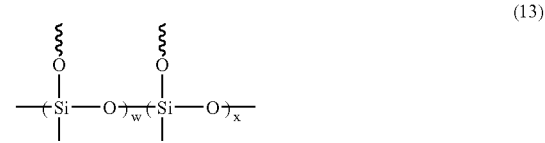
(13)

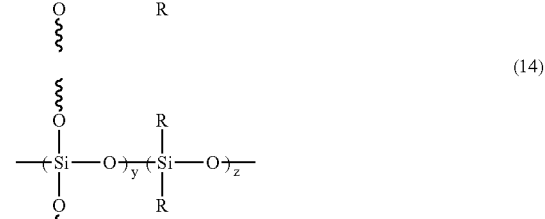
(14)

wherein R is a monovalent organic radical; and w, x, y and z are each independently positive integers. In some embodiments, a polymer including a structure of Formula 13 includes 10-99% "w" monomeric units and 1-90% "x" monomeric units. In some embodiments, a polymer including a structure of Formula 14 includes 10-99% "y" monomeric units and 1-90% "z" monomeric units In some embodiments of the present invention, hardmask compositions for a resist underlayer film include (a) a first polymer including about 10 to about 99 mol %, based on the total moles of silicon-containing monomeric units, of the monomeric unit of Formula 7 below:

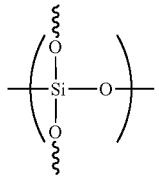
(7)

and about 1 to about 90 mol %, based on the total moles of silicon-containing monomeric units, of at least one monomeric unit selected from the monomeric units of Formulae 8 and 9 below:

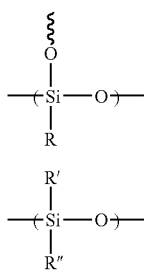
(8)

(9)

wherein R, R' and R" are each independently a monovalent organic group;

(b) a second polymer that includes at least one of the structures represented by Formulae 3-6;

(c) an acid or base catalyst; and (d) an organic solvent.

The hydrolysis and condensation for the synthesis of the first polymer may be suitably controlled by varying the kind, the amount and the addition method of the acid or base catalyst. Any suitable base catalyst may be used in the hardmask compositions of the invention, but in some embodiments, the base catalyst includes one or more ammonium hydroxides of the formula NH$_4$OH or N(R')$_4$OH, wherein R' is a monovalent organic group. Furthermore, any suitable acid catalyst may be used, but in some embodiments of the invention, the acid catalyst may be p-toluenesulfonic acid monohydrate, pyridinium p-toluenesulfonate, 2,4,4,6-tetrabromocyclohexadienone, benzoin tosylate, 2-nitrobenzyl tosylate or alkyl esters of organic sulfonic acids.

In some hardmask compositions of the present invention, the first polymer is present in an amount in a range of about 1 to about 50 parts by weight, and in some embodiments, in a range of about 1 to about 30 parts by weight, based on the total weight of the composition. In some hardmask compositions of the present invention, the second polymer may be present in an amount in a range of about 1 to about 30 parts by weight, based on the total weight of the composition.

Some hardmask compositions according to the present invention may further include one or more of a crosslinking agent and a surfactant.

As the organic solvent used in a hardmask composition according to an embodiment of the invention, there may be used a single solvent or a mixture of two or more solvents (co-solvents). When a mixture of two or more solvents is used as the organic solvent, at least one solvent is preferably a high-boiling point solvent. The high-boiling point solvent may act to prevent formation of voids and may allow a film produced by the hardmask composition to be dried at a relatively slow rate, leading to an improvement in film flatness. As used herein, the term "high-boiling point solvent" refers to a solvent that is evaporated at a temperature lower than the coating, drying and curing temperatures of a composition according to an embodiment of the present invention.

Embodiments of the present invention further include methods for producing a semiconductor integrated circuit device, including the steps of:

(a) providing a material layer on a substrate;

(b) forming a hardmask layer on the material layer wherein the hardmask layer is composed of an organic material;

(c) forming an antireflective hardmask layer using the hardmask composition according to an embodiment of the invention for a resist underlayer film on the material layer;

(d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

In some embodiments of the present invention, a semiconductor integrated circuit device produced by a method embodiment of the invention is provided.

The compositions and methods of the present invention may be used, for example, in the formation of patterned material layer structures, e.g., metal wiring lines, contact holes and biases, insulating sections, e.g., damascene trenches and shallow trench isolation, and trenches for capacitor structures, e.g., trenches used in the design of integrated circuit devices. The compositions and methods of the present invention may be particularly useful in the formation of patterned oxide, nitride, polysilicon and chromium oxides.

EXAMPLES

Hereinafter, the present invention will be more specifically explained with reference to the following examples. However, these examples are given for the purpose of illustration and are not to be construed as limiting the scope of the invention.

Synthesis Example 1

63.6 g of methyltrimethoxysilane and 56.4 g of methylsilicate (MS-56) were dissolved in 269 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 1.2 g of p-toluenesulfonic acid monohydrate in 47.4 g of ion-exchange water over one hour. After the resulting mixture was reacted at 60° C. for 4 hours, the reaction solution was allowed to cool to room temperature. 59.5 g of the PGMEA solution containing methanol was removed from the reaction solution to obtain a sample solution.

Synthesis Example 2

29.6 g of methyltrimethoxysilane, 3.96 g of phenyltrimethoxysilane and 26.4 g of methylsilicate (MS-56) were dissolved in 134.6 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 0.6 g of p-toluenesulfonic acid monohydrate in 23.2 g of ion-exchange water over one hour. After the resulting mixture was reacted at 60° C. for 4 hours, the reaction solution was allowed to cool to room temperature. 28.8 g of the PGMEA solution containing methanol was removed from the reaction solution to obtain a sample solution.

Synthesis Example 3

48.0 g of methyltrimethoxysilane, 17.9 g of phenyltrimethoxysilane and 54.1 g of methylsilicate (MS-56) were dissolved in 269.2 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 1.2 g of p-toluenesulfonic acid monohydrate in 47.4 g of ion-exchange water over one hour. After the resulting mixture was reacted at 60° C. for 4 hours, the reaction solution was allowed to cool to room temperature. 47.4 g of the PGMEA solution containing methanol was removed from the reaction solution to obtain a sample solution.

Synthesis Example 4

30.3 g of methyltrimethoxysilane, 1.5 g of propyltrimethoxysilane and 28.2 g of methylsilicate (MS-56) were dissolved in 134 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 0.6 g of p-toluenesulfonic acid monohydrate in 23.2 g of ion-exchange water over one hour. After the resulting mixture was reacted at 60° C. for 4 hours, the reaction solution was allowed to cool to room temperature. 31.3 g of the PGMEA solution containing methanol was removed from the reaction solution to obtain a sample solution.

Synthesis Example 5

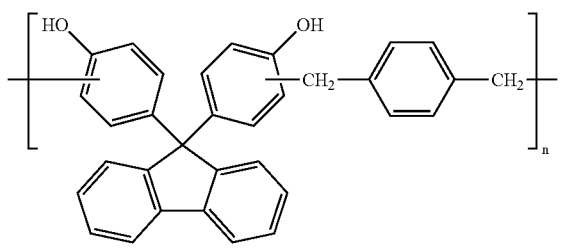

8.31 g (0.05 moles) of 1,4-bis(methoxymethyl)benzene, 0.154 g (0.001 moles) of diethyl sulfate and 200 g of γ-butyrolactone were stirred in a one-liter four-neck flask equipped with a mechanical agitator, a condenser, a 300-ml dropping funnel, and nitrogen feed tube for 10 minutes while nitrogen gas was supplied to the flask. A solution of 28.02 g (0.08 moles) of 4,4'-(9-fluorenylidene)diphenol in 200 g of γ-butyrolactone was slowly added dropwise for 30 minutes. The mixture was allowed to react for 12 hours. After completion of the reaction, the acid was removed using water, followed by concentration by an evaporator. Subsequently, the concentrate was diluted with MAK and methanol to obtain a 15 wt % solution in MAK/MeOH (4:1, w/w). The solution thus obtained was transferred to a 3-L separatory funnel, and then n-heptane was added thereto to remove low molecular weight compounds containing unreacted monomers, yielding the desired phenol resin ($M_w$=12,000, polydispersity=2.0, n=23).

Synthesis Example 6

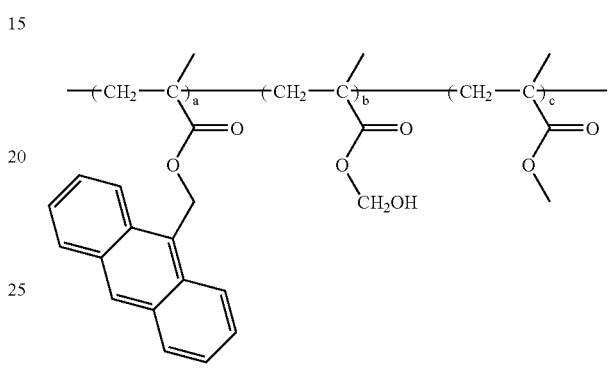

100 g (0.36 moles) of anthracene methyl methacrylate (AMMA), 36.23 g (0.36 moles) of methylmethacrylate (MMA), 62.8 g (0.48 moles) of hydroxymethylmethacrylate and 1.5 g of V65 were reacted in THF (400 g) at 70° C. for 6 hours in a one-liter four-neck flask equipped with a mechanical agitator, a condenser, and nitrogen feed tube for 10 minutes while nitrogen gas was supplied to the flask. After completion of the reaction, the reaction solution was added dropwise to 12 L of hexane to obtain a precipitate. The precipitate was separated using a funnel, and dried in a vacuum oven for 72 hours, yielding the desired polymer ($M_w$=23,400, polydispersity=3.5, n=44).

Synthesis Example 7

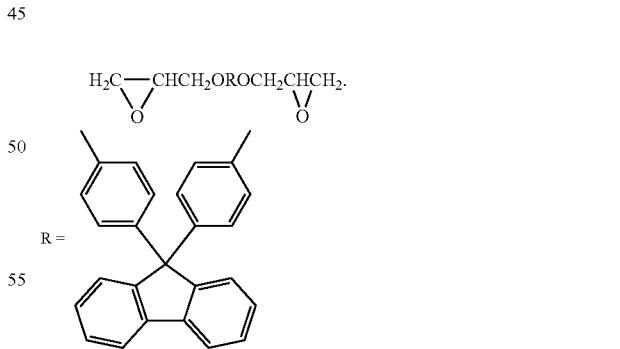

122.64 g of 9,9-bis(hydroxyphenyl)fluorene and 323.82 g of epichlorohydrin were added to a one-liter four-neck flask equipped with a mechanical agitator, a condenser, a dropping funnel and nitrogen feed tube, and stirred for 30 minutes until the temperature of the solution reached 80° C. Thereafter, 28 g of an aqueous NaOH solution (50%) was added dropwise to the reaction solution over 4 hours. After the reaction product was washed with water, the remaining reaction solvents were evaporated using an evaporator, followed by drying in a vacuum oven at 50° C. for 48 hours, yielding the sample.

Synthesis Example 8

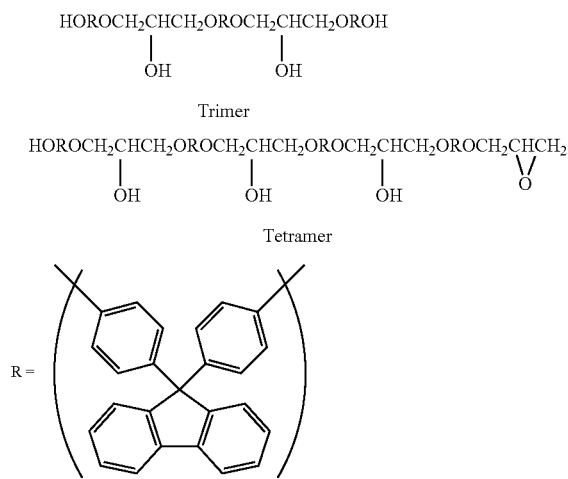

100 g of the diglycidyl ethers prepared in Synthesis Example 5 was added to a one-liter four-neck flask equipped with a mechanical agitator, a condenser, a dropping funnel and nitrogen feed tube, and slowly heated from 150° C. to 210° C. for 2 hours. Thereafter, 126 g of 9,9-bis(hydroxyphenyl)fluorene was slowly added to the flask and sufficiently stirred. After completion of the addition, the mixture was further stirred for about one hour to obtain the trimer. At this time, p-toluenesulfonic acid (0.5 wt %) was used as a reaction catalyst. The trimer was reacted with an equimolar amount of the diglycidyl ethers to prepare the tetramer having a terminal epoxy group.

Synthesis Example 9

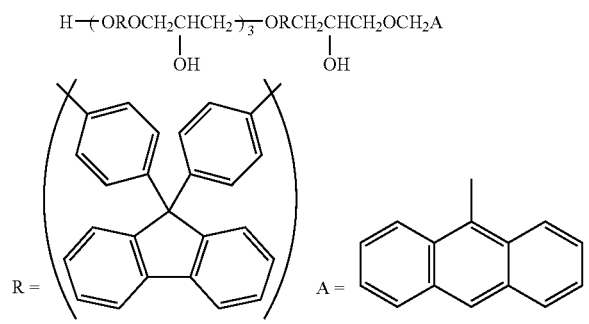

90 g of the tetramer prepared in Synthesis Example 8, 63 g of 9-hydroxymethyl anthracene, 300 g of PGMEA and 0.32 g of p-toluenesulfonic acid were added to a one-liter four-neck flask equipped with a mechanical agitator, a condenser, a dropping funnel and nitrogen feed tube, and reacted at 150° C. for 4 hours. After the reaction product was washed with water, the remaining reaction solvent was evaporated using an evaporator, followed by drying in a vacuum oven at 50° C. for 48 hours, yielding the sample.

Synthesis Example 10

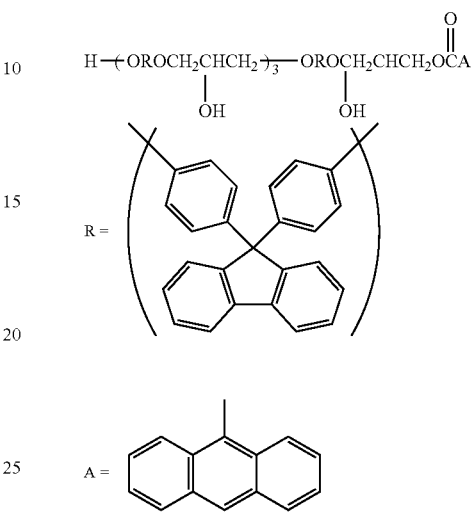

90 g of the tetramer prepared in Synthesis Example 8, 66 g of 9-anthracenecarboxylic acid, 300 g of PGMEA and 0.32 g of p-toluenesulfonic acid were added to a one-liter four-neck flask equipped with a mechanical agitator, a condenser, a dropping funnel and nitrogen feed tube, and reacted at 150° C. for 4 hours. After the reaction product was washed with water, the remaining reaction solvent was evaporated using an evaporator, followed by drying in a vacuum oven at 50° C. for 48 hours, yielding the sample.

Synthesis Example 11

10 g of anthracenemethyl propane sulfonate (APS), 30 g of polyhydroxystyrene (PHS) and 2 g of sodium hydride (NaH, 60%) were reacted in THF at 70° C. for 6 hours in a one-liter four-neck flask equipped with a mechanical agitator, a condenser, and nitrogen feed tube while nitrogen gas was supplied to the flask, to give polyhydroxystyrene-co-anthraceneoxystyrene. After completion of the reaction, the reaction solution was added dropwise to 8 L of hexane to obtain a precipitate. The precipitate was separated using a funnel, and dried in a vacuum oven for 72 hours, yielding the following desired polymer ($M_w$=12,400, polydispersity=2.4, n=26).

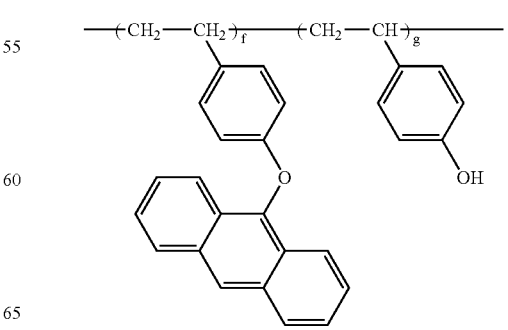

Example 1

5 g of the polymer prepared in Synthesis Example 5 was dissolved in 48.12 g of the sample solution obtained in Synthesis Example 1, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 2

5 g of the polymer prepared in Synthesis Example 5 was dissolved in 48.12 g of the sample solution obtained in Synthesis Example 2, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 3

5 g of the polymer prepared in Synthesis Example 5 was dissolved in 48.12 g of the sample solution obtained in Synthesis Example 3, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 4

5 g of the polymer prepared in Synthesis Example 5 was dissolved in 48.12 g of the sample solution obtained in Synthesis Example 4, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 5

5 g of the polymer prepared in Synthesis Example 6 was dissolved in 48.12 g of the sample solution obtained in Synthesis Example 1, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 6

5 g of the polymer prepared in Synthesis Example 6 was dissolved in 48.12 g of the sample solution obtained in Synthesis Example 2, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 7

5 g of the polymer prepared in Synthesis Example 6 was dissolved in 48.12 g of the sample solution obtained in Synthesis Example 3, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 8

5 g of the polymer prepared in Synthesis Example 6 was dissolved in 48.12 g of the sample solution obtained in Synthesis Example 4, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 9

5 g of the compound prepared in Synthesis Example 9 was dissolved in 48.12 g of the sample solution obtained in Synthesis Example 1, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 10

5 g of the compound prepared in Synthesis Example 9 was dissolved in 48.12 g of the sample solution obtained in Synthesis Example 2, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 11

5 g of the compound prepared in Synthesis Example 10 was dissolved in 48.12 g of the sample solution obtained in Synthesis Example 3, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 12

5 g of the compound prepared in Synthesis Example 10 was dissolved in 48.12 g of the sample solution obtained in Synthesis Example 4, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 13

5 g of the polymer prepared in Synthesis Example 11 was dissolved in 48.12 g of the sample solution obtained in Synthesis Example 1, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 14

5 g of the polymer prepared in Synthesis Example 11 was dissolved in 48.12 g of the sample solution obtained in Synthesis Example 2, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 15

5 g of the polymer prepared in Synthesis Example 11 was dissolved in 48.12 g of the sample solution obtained in Synthesis Example 3, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Example 16

5 g of the polymer prepared in Synthesis Example 11 was dissolved in 48.12 g of the sample solution obtained in Synthesis Example 4, and then 131 g of PGMEA and 70.5 g of cyclohexanone were added thereto to prepare a dilution. A solution (0.624 g) of pyridine (10 wt %) in PGMEA was added to the dilution to prepare a final sample solution.

Comparative Example 1

0.8 g of the polymer prepared in Synthesis Example 6, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

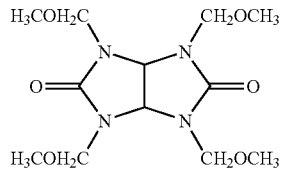

Structure of Powderlink 1174

Comparative Example 2

131 g of PGMEA and 70.5 g of cyclohexanone were added to 48.12 g of the sample solution obtained in Synthesis Example 1 to prepare a dilution. A solution (0.624 g) of pyridine (10 wt %) in PGMEA was added to the dilution to prepare a final sample solution.

Comparative Example 3

131 g of PGMEA and 70.5 g of cyclohexanone were added to 48.12 g of the sample solution obtained in Synthesis Example 2 to prepare a dilution. A solution (0.624 g) of pyridine (10 wt %) in PGMEA was added to the dilution to prepare a final sample solution.

Comparative Example 4

130 g of PGMEA and 70.5 g of cyclohexanone were added to 49.10 g of the sample solution obtained in Synthesis Example 3 to prepare a dilution. A solution (0.624 g) of pyridine (10 wt %) in PGMEA was added to the dilution to prepare a final sample solution.

Comparative Example 5

132 g of PGMEA and 70.5 g of cyclohexanone were added to 47.34 g of the sample solution obtained in Synthesis Example 4 to prepare a dilution. A solution (0.624 g) of pyridine (10 wt %) in PGMEA was added to the dilution to prepare a final sample solution.

Comparative Example 6

0.8 g of the polymer prepared in Synthesis Example 5, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

Comparative Example 7

0.8 g of the compound prepared in Synthesis Example 9, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

Comparative Example 8

0.8 g of the compound prepared in Synthesis Example 10, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

Comparative Example 9

0.8 g of the polymer prepared in Synthesis Example 11, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

Each of the sample solutions prepared in Examples 1-16 and Comparative Examples 1-9 was spin-coated onto a silicon wafer and baked at 200° C. for 60 seconds to form a 1,000 Å-thick film.

The refractive index (n) and extinction coefficient (k) of the films were measured using an ellipsometer (J. A. Woolam). The results are shown in Table 1.

TABLE 1

| Samples used in formation of films | Optical properties (193 m) | | Optical properties (248 m) | |
|---|---|---|---|---|
| | Refractive index (n) | Extinction coefficient (k) | Refractive index (n) | Extinction coefficient (k) |
| Example 1 | 1.69 | 0.38 | 1.67 | 0.11 |
| Example 2 | 1.69 | 0.43 | 1.67 | 0.10 |
| Example 3 | 1.71 | 0.48 | 1.67 | 0.09 |
| Example 4 | 1.68 | 0.38 | 1.67 | 0.11 |
| Example 5 | 1.62 | 0.30 | 1.60 | 0.20 |
| Example 6 | 1.64 | 0.37 | 1.59 | 0.18 |
| Example 7 | 1.69 | 0.36 | 1.61 | 0.19 |
| Example 8 | 1.65 | 0.31 | 1.58 | 0.20 |
| Example 9 | 1.63 | 0.32 | 1.62 | 0.21 |
| Example 10 | 1.67 | 0.34 | 1.58 | 0.20 |
| Example 11 | 1.65 | 0.39 | 1.58 | 0.18 |
| Example 12 | 1.62 | 0.37 | 1.60 | 0.20 |
| Example 13 | 1.63 | 0.29 | 1.59 | 0.21 |
| Example 14 | 1.63 | 0.36 | 1.62 | 0.19 |
| Example 15 | 1.72 | 0.36 | 1.63 | 0.17 |
| Example 16 | 1.66 | 0.30 | 1.57 | 0.24 |
| Comparative Example 1 | 1.68 | 0.12 | 1.43 | 0.50 |
| Comparative Example 2 | 1.56 | 0.02 | 1.49 | 0.00 |
| Comparative Example 3 | 1.57 | 0.12 | 1.47 | 0.00 |
| Comparative Example 4 | 1.70 | 0.23 | 1.55 | 0.00 |
| Comparative Example 5 | 1.56 | 0.02 | 1.49 | 0.00 |
| Comparative Example 6 | 1.42 | 0.72 | 0.02 | 0.27 |
| Comparative Example 7 | 1.41 | 0.75 | 1.95 | 0.30 |

TABLE 1-continued

| Samples used in formation of films | Optical properties (193 m) | | Optical properties (248 m) | |
|---|---|---|---|---|
| | Refractive index (n) | Extinction coefficient (k) | Refractive index (n) | Extinction coefficient (k) |
| Comparative Example 8 | 1.44 | 0.76 | 1.90 | 0.29 |
| Comparative Example 9 | 1.65 | 0.11 | 1.40 | 0.51 |

The sample solution prepared in Comparative Example 6 was spin-coated on a silicon wafer and baked at 200° C. for 60 seconds to form a 5,000 Å-thick film.

Then, each of the sample solutions prepared in Examples 1-16 and Comparative Examples 1-8 was spin-coated on the film and baked at 200° C. for 60 seconds to form a 1,500 Å-thick film. A photoresist for KrF was coated onto the film, baked at 110° C. for 60 seconds, light-exposed using an exposure system manufactured by ASML (XT:1400, NA 0.93), and developed with TMAH (a 2.38 wt % aqueous solution) to form an 90-nm line and space pattern. The 90-nm line and space pattern was observed using an FE-SEM, and the obtained results are shown in Table 2 below. Exposure latitude (EL) margin according to the changes in exposure energy and depth of focus (DoF) margin according to the changes in the distance from a light source were measured. The results are shown in Table 2.

TABLE 2

| | Pattern Characteristics | |
|---|---|---|
| Samples used in formation of films | EL margin (Δ mJ/exposure energy mJ) | DoF margin (μm) |
| Example 1 | 3 | 0.2 |
| Example 2 | 3 | 0.2 |
| Example 3 | 3 | 0.2 |
| Example 4 | 3 | 0.2 |
| Example 5 | 3 | 0.2 |
| Example 6 | 3 | 0.2 |
| Example 7 | 3 | 0.2 |
| Example 8 | 3 | 0.2 |
| Example 9 | 3 | 0.2 |
| Example 10 | 3 | 0.2 |
| Example 11 | 3 | 0.2 |
| Example 12 | 3 | 0.2 |
| Example 13 | 3 | 0.2 |
| Example 14 | 3 | 0.2 |
| Example 15 | 3 | 0.2 |
| Example 16 | 3 | 0.2 |
| Comparative Example 2 | 2 | 0.2 |
| Comparative Example 3 | 1 | 0.1 |
| Comparative Example 4 | 2 | 0.2 |
| Comparative Example 5 | 2 | 0.2 |
| Comparative Example 7 | 1 | 0.1 |
| Comparative Example 8 | 1 | 0.1 |

The patterned specimens were dry-etched using a mixed gas of $CHF_3/CF_4$, dry-etched using a mixed gas of $CHF_3/CF_4$ containing oxygen, and dry-etched using a mixed gas of $BCl_3/C_2$. Finally, all remaining organic materials were removed using $O_2$, and the cross section of the specimens was observed using an FE-SEM. The results are shown in Table 3.

TABLE 3

| Samples used in formation of films | Pattern shape after etching |
|---|---|
| Example 1 | Vertical |
| Example 2 | Vertical |
| Example 3 | Vertical |
| Example 4 | Vertical |
| Example 5 | Vertical |
| Example 6 | Vertical |
| Example 7 | Vertical |
| Example 8 | Vertical |
| Example 9 | Vertical |
| Example 10 | Vertical |
| Example 11 | Vertical |
| Example 12 | Vertical |
| Example 13 | Vertical |
| Example 14 | Vertical |
| Example 15 | Vertical |
| Example 16 | Vertical |
| Comparative Example 2 | Vertical |
| Comparative Example 3 | Slightly tapered |
| Comparative Example 4 | Vertical |
| Comparative Example 5 | Slightly tapered |
| Comparative Example 7 | Severely tapered |
| Comparative Example 8 | Severely tapered |

The sample solution prepared in Comparative Example 6 was spin-coated on a silicon wafer and baked at 200° C. for 60 seconds to form a 5,000 Å-thick film. Then, each of the sample solutions prepared in Examples 1-16 and Comparative Examples 1-8 was spin-coated on the film and baked at 200° C. for 60 seconds to form a 1,500 Å-thick film. A photoresist for ArF was coated onto the film, baked at 110° C. for 60 seconds, light-exposed using an ArF exposure system (ASML1250, FN70 5.0 active, NA 0.82), and developed with TMAH (a 2.38 wt % aqueous solution) to form an 80-nm line and space pattern. The 80-nm line and space pattern was observed using an FE-SEM, and the obtained results are shown in Table 4 below. Exposure latitude (EL) margin according to the changes in exposure energy and depth of focus (DoF) margin according to the changes in the distance from a light source were measured. The results are shown in Table 4.

TABLE 4

| | Pattern Characteristics | |
|---|---|---|
| Samples used in formation of films | EL margin (Δ mJ/exposure energy mJ) | DoF margin (μm) |
| Example 1 | 3 | 0.2 |
| Example 2 | 3 | 0.2 |
| Example 3 | 3 | 0.2 |
| Example 4 | 3 | 0.2 |
| Example 5 | 3 | 0.2 |
| Example 6 | 3 | 0.2 |
| Example 7 | 3 | 0.2 |
| Example 8 | 3 | 0.2 |
| Example 9 | 3 | 0.2 |
| Example 10 | 3 | 0.2 |
| Example 11 | 3 | 0.2 |
| Example 12 | 3 | 0.2 |
| Example 13 | 3 | 0.2 |
| Example 14 | 3 | 0.2 |
| Example 15 | 3 | 0.2 |
| Example 16 | 3 | 0.2 |
| Comparative Example 2 | 1 | 0.1 |
| Comparative Example 3 | 2 | 0.2 |
| Comparative Example 4 | 2 | 0.2 |
| Comparative Example 5 | 1 | 0.1 |

TABLE 4-continued

| Samples used in formation of films | Pattern Characteristics | |
|---|---|---|
| | EL margin (Δ mJ/exposure energy mJ) | DoF margin (μm) |
| Comparative Example 7 | 1 | 0.1 |
| Comparative Example 8 | 1 | 0.1 |

The patterned specimens (Table 4) were dry-etched using a mixed gas of $CHF_3/CF_4$, dry-etched using a mixed gas of $CHF_3/CF_4$ containing oxygen, and dry-etched using a mixed gas of $CHF_3/CF_4$. Finally, all remaining organic materials were removed using $O_2$, and the cross section of the specimens was observed using an FE-SEM. The results are shown in Table 5.

TABLE 5

| Samples used in formation of films | Pattern shape after etching |
|---|---|
| Example 1 | Vertical |
| Example 2 | Vertical |
| Example 3 | Vertical |
| Example 4 | Vertical |
| Example 5 | Vertical |
| Example 6 | Vertical |
| Example 7 | Vertical |
| Example 8 | Vertical |
| Example 9 | Vertical |
| Example 10 | Vertical |
| Example 11 | Vertical |
| Example 12 | Vertical |
| Example 13 | Vertical |
| Example 14 | Vertical |
| Example 15 | Vertical |
| Example 16 | Vertical |
| Comparative Example 2 | Slightly tapered |
| Comparative Example 3 | Vertical |
| Comparative Example 4 | Vertical |
| Comparative Example 5 | Slightly tapered |
| Comparative Example 7 | Severely tapered |
| Comparative Example 8 | Severely tapered |

The invention claimed is:

1. A hardmask composition for a resist underlayer film, comprising:
   (a) a first polymer prepared by the reaction of a compound of Formula 1

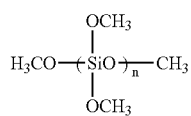

(1)

wherein n is a number of 3 to 20, with a compound of Formula 2

$(R)_m$—Si—$(OCH_3)_{4-m}$      (2)

wherein R is a monovalent organic group and m is 0, 1 or 2;
   (b) a second polymer comprising a structure represented by Formula 3

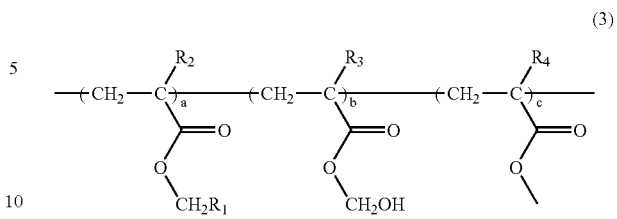

wherein $R_1$ is aryl; $R_2$, $R_3$ and $R_4$ are each independently selected from the group consisting of hydrogen, alkyl, aryl and allyl; and a, b and c are each independently a positive integer;
   (c) an acid or base catalyst; and
   (d) an organic solvent.

2. The hardmask composition of claim 1, wherein $R_1$ is selected from the group consisting of phenyl, naphthyl and anthracenyl; and $R_2$, $R_3$ and $R_4$ are each independently selected from the group consisting of hydrogen, $C_{1-10}$ alkyl, $C_{6-10}$ aryl and allyl; and a, b and c are each independently an integer from 1 to 60.

3. The hardmask composition according to claim 1, wherein the base catalyst comprises one or more ammonium hydroxides of the formula $NH_4OH$ or $N(R')_4OH$, wherein R' is a monovalent organic group.

4. The hardmask composition according to claim 1, wherein the acid catalyst is selected from the group consisting of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

5. The hardmask composition according to claim 1, wherein the first polymer is present in an amount in a range of about 1 to about 50 parts by weight, based on the total weight of the composition.

6. The hardmask composition according to claim 1, wherein the second polymer is present in an amount in a range of about 1 to about 30 parts by weight, based on the total weight of the composition.

7. The hardmask composition according to claim 1, wherein the first polymer comprises at least one structure selected from the structures represented by Formulae 10-14:

(10)

(11)

(12)

-continued

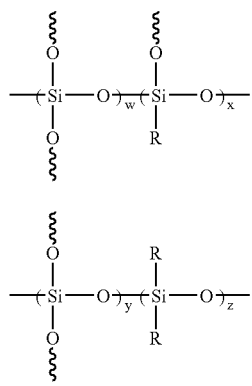

wherein R is a monovalent organic radical; and w, x, y and z are each independently positive integers.

8. The hardmask composition according to claim 1, further comprising one or more of a crosslinking agent and a surfactant.

9. A hardmask composition for a resist underlayer film, comprising:

(a) a first polymer prepared by the reaction of a compound of Formula 1

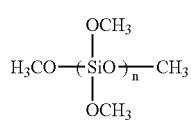

wherein n is a number of 3 to 20, with a compound of Formula 2

wherein R is a monovalent organic group and m is 0, 1 or 2;

(b) a second polymer comprising a structure represented by Formula 4

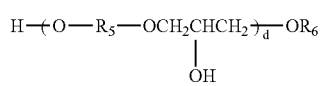

wherein $R_5$ is an arylene; $R_6$ is selected from the group consisting of hydroxyaryl, epoxy-substituted aryl, arylalkyl and an arylcarbonyl; and d is a positive integer;

(c) an acid or base catalyst; and (d) an organic solvent.

10. The hardmask composition of claim 9, wherein $R_5$ is selected from one of the following two arylene groups

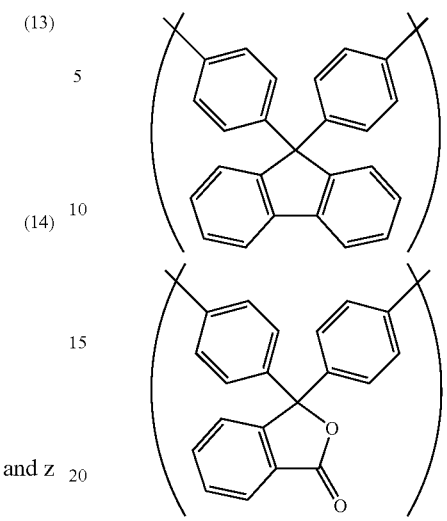

$R_6$ is selected from the group consisting of $R_5OH$,

$CH_2R_7$ and $C(=O)R_7$, wherein $R_7$ is selected from the group consisting of anthracenyl, naphthyl and phenyl; and d is an integer from 3 to 20.

11. The hardmask composition according to claim 9, wherein the base catalyst comprises one or more ammonium hydroxides of the formula $NH_4OH$ or $N(R')_4OH$, wherein R' is a monovalent organic group.

12. The hardmask composition according to claim 9, wherein the acid catalyst is selected from the group consisting of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

13. The hardmask composition according to claim 9, wherein the first polymer is present in an amount in a range of about 1 to about 50 parts by weight, based on the total weight of the composition.

14. The hardmask composition according to claim 9, wherein the second polymer is present in an amount in a range of about 1 to about 30 parts by weight, based on the total weight of the composition.

15. The hardmask composition according to claim 9, wherein the first polymer comprises at least one structure selected from the structures represented by Formulae 10-14:

-continued

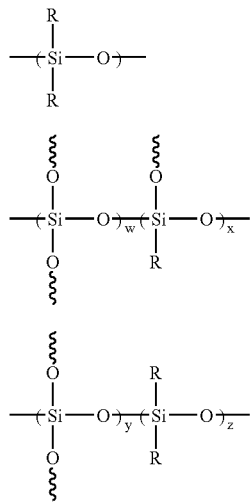

(12)

(13)

(14)

wherein R is a monovalent organic radical; and w, x, y and z are each independently positive integers.

16. The hardmask composition according to claim 9, further comprising one or more of a crosslinking agent and a surfactant.

17. A hardmask composition for a resist underlayer film, comprising:
(a) a first polymer prepared by the reaction of a compound of Formula 1

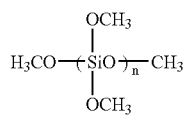

(1)

wherein n is a number of 3 to 20, with a compound of Formula 2

$(R)_m$—Si—$(OCH_3)_{4-m}$ (2)

wherein R is a monovalent organic group and m is 0, 1 or 2;
(b) a second polymer comprising a structure represented by Formula 5 below:

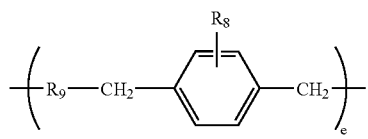

(5)

$R_8$ is selected from the group consisting of hydrogen, alkyl, aryl and allyl; $R_9$ is hydroxyarylene and e is a positive integer;
(c) an acid or base catalyst; and
(d) an organic solvent.

18. The hardmask composition according to claim 17, wherein $R_8$ is selected from the group consisting of hydrogen, $C_{1-10}$ alkyl, $C_{6-10}$ aryl and allyl, $R_9$ is selected from the group consisting of hydroxynapthylidene, hydroxyphenylene and a compound having the structure of

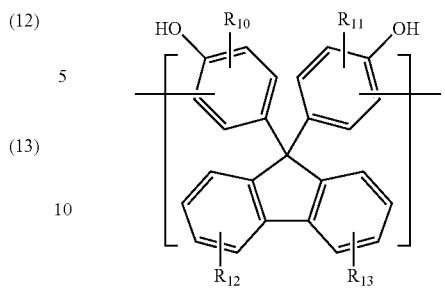

wherein $R_{10}$ and $R_{11}$ are each independently selected from the group consisting of hydrogen, hydroxyl, $C_{1-10}$ alkyl, $C_{6-10}$ aryl, allyl and halogen, and $R_{12}$ and $R_{13}$ are each independently selected from the group consisting of hydrogen, a crosslinking functionality and a chromophore; and e is an integer from 1 to 190.

19. The hardmask composition according to claim 17, wherein the base catalyst comprises one or more ammonium hydroxides of the formula $NH_4OH$ or $N(R')_4OH$, wherein R' is a monovalent organic group.

20. The hardmask composition according to claim 17, wherein the acid catalyst is selected from the group consisting of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

21. The hardmask composition according to claim 17, wherein the first polymer is present in an amount in a range of about 1 to about 50 parts by weight, based on the total weight of the composition.

22. The hardmask composition according to claim 17, wherein the second polymer is present in an amount in a range of about 1 to about 30 parts by weight, based on the total weight of the composition.

23. The hardmask composition according to claim 17, wherein the first polymer comprises at least one structure selected from the structures represented by Formulae 10-14:

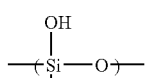

(10)

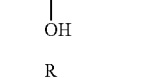

(11)

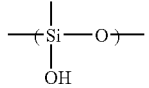

(12)

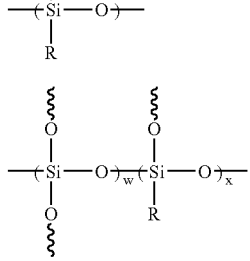

(13)

-continued

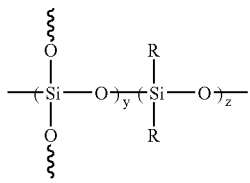
(14)

wherein R is a monovalent organic radical; and w, x, y and z are each independently positive integers.

24. The hardmask composition according to claim 17, further comprising one or more of a crosslinking agent and a surfactant.

25. A hardmask composition for a resist underlayer film, comprising:
(a) a first polymer prepared by the reaction of a compound of Formula 1

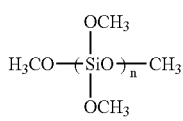
(1)

wherein n is a number of 3 to 20, with a compound of Formula 2

$(R)_m—Si—(OCH_3)_{4-m}$ (2)

wherein R is a monovalent organic group and m is 0, 1 or 2;
(b) a second polymer comprising a structure represented by Formula 6 below:

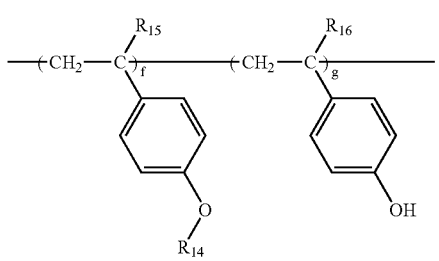
(6)

wherein $R_{14}$ is aryl; $R_{15}$ and $R_{16}$ are each independently selected from the group consisting of hydrogen, alkyl, aryl and allyl; and f and g are each independently a positive integer;
(c) an acid or base catalyst; and
(d) an organic solvent.

26. The hardmask composition according to claim 25, wherein $R_{14}$ is selected from the group consisting of phenyl, naphthyl and anthracenyl; $R_{15}$ and $R_{16}$ are each independently selected from the group consisting of hydrogen, $C_{1-10}$ alkyl, $C_{6-10}$ aryl and allyl; and f and g are each independently an integer from 1 to 60.

27. The hardmask composition according to claim 25, wherein the base catalyst comprises one or more ammonium hydroxides of the formula $NH_4OH$ or $N(R')_4OH$, wherein R' is a monovalent organic group.

28. The hardmask composition according to claim 25, wherein the acid catalyst is selected from the group consisting of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

29. The hardmask composition according to claim 25, wherein the first polymer is present in an amount in a range of about 1 to about 50 parts by weight, based on the total weight of the composition.

30. The hardmask composition according to claim 25, wherein the second polymer is present in an amount in a range of about 1 to about 30 parts by weight, based on the total weight of the composition.

31. The hardmask composition according to claim 25, wherein the first polymer comprises at least one structure selected from the structures represented by Formulae 10-14:

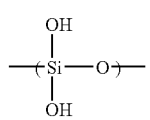
(10)

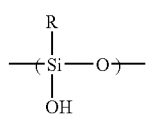
(11)

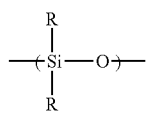
(12)

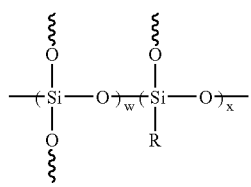
(13)

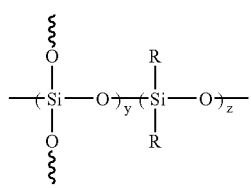
(14)

wherein R is a monovalent organic radical; and w, x, y and z are each independently positive integers.

32. The hardmask composition according to claim 25, further comprising one or more of a crosslinking agent and a surfactant.

33. A hardmask composition for a resist underlayer film, comprising:
(a) a first polymer comprising about 10 to about 99 mol %, based on the total moles of silicon-containing monomeric units, of the monomeric unit of Formula 7 below:

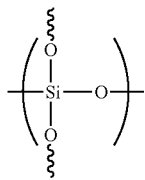
(7)

and about 1 to about 90 mol %, based on the total moles of silicon-containing monomeric units, of at least one monomeric unit selected from the monomeric units of Formulae 8 and 9 below:

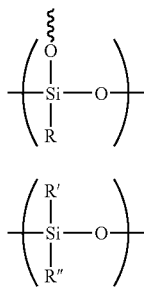
(8)
(9)

wherein R, R' and R" are each independently a monovalent organic group;

(b) a second polymer comprising at least one structure selected from the structures represented by Formulae 3 to 6

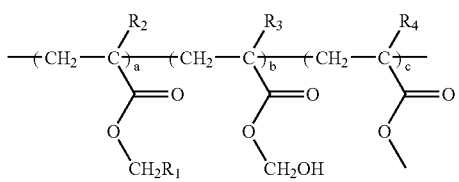
(3)

wherein $R_1$ is aryl; $R_2$, $R_3$ and $R_4$ are each independently selected from the group consisting of hydrogen, alkyl, aryl and allyl; and a, b and c are each independently a positive integer;

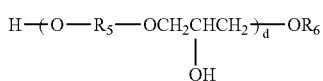
(4)

wherein $R_5$ is an arylene; $R_6$ is selected from the group consisting of hydroxyaryl, epoxy-substituted aryl, arylalkyl and an arylcarbonyl; and d is a positive integer;

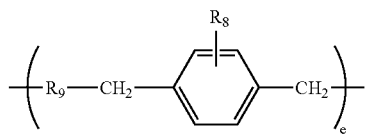
(5)

$R_8$ is selected from the group consisting of hydrogen, alkyl, aryl and allyl; $R_9$ is hydroxyarylene and e is a positive integer;

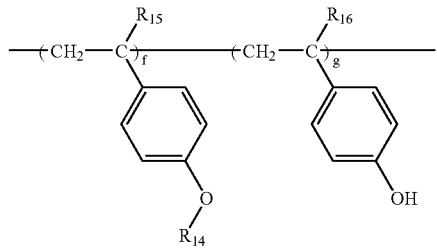
(6)

wherein $R_{14}$ is aryl; $R_{15}$ and $R_{16}$ are each independently selected from the group consisting of hydrogen, alkyl, aryl and allyl; and f and g are each independently a positive integer;

(c) an acid or base catalyst; and (d) an organic solvent.

34. The hardmask composition of claim 33, wherein $R_1$ is selected from the group consisting of phenyl, naphthyl and anthracenyl;

$R_2$, $R_3$ and $R_4$ are each independently selected from the group consisting of hydrogen, $C_{1-10}$ alkyl, $C_{6-10}$ aryl and allyl;

$R_5$ is selected from one of the following two arylene groups

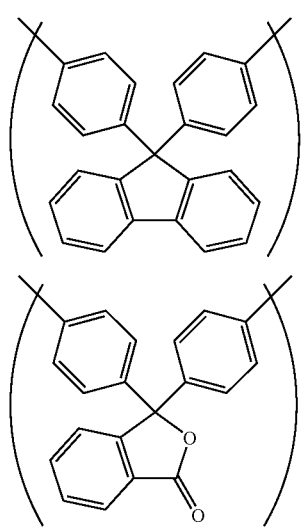

$R_6$ is selected from the group consisting of $R_5OH$,

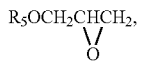

$CH_2R_7$ and $C(=O)R_7$, wherein $R_7$ is selected from the group consisting of anthracenyl, naphthyl and phenyl;

$R_8$ is selected from the group consisting of hydrogen, $C_{1-10}$ alkyl, $C_{6-10}$ aryl and allyl;

$R_9$ is selected from the group consisting of hydroxynapthylidene, hydroxyphenylene and a compound having the structure of

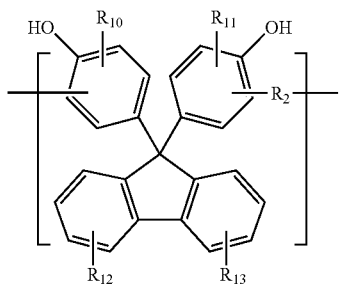

wherein $R_{10}$ and $R_{11}$ are each independently selected from the group consisting of hydrogen, hydroxyl, $C_{1-10}$ alkyl, $C_{6-10}$ aryl, allyl and halogen, and $R_{12}$ and $R_{13}$ are each independently selected from the group consisting of hydrogen, a crosslinking functionality and a chromophore;

$R_{14}$ is selected from the group consisting of phenyl, naphthyl and anthracenyl;

$R_{15}$ and $R_{16}$ are each independently selected from the group consisting of hydrogen, $C_{1-10}$ alkyl, $C_{6-10}$ aryl and allyl; and a, b and c are each independently an integer from 1 to 60, d is an integer from 3 to 20, e is an integer from 1 to 190, and f and g are each independently an integer from 1 to 60.

35. The hardmask composition according to claim 33, wherein the base catalyst comprises one or more ammonium hydroxides of the formula $NH_4OH$ or $N(R')_4OH$, wherein R' is a monovalent organic group.

36. The hardmask composition according to claim 33, wherein the acid catalyst is selected from the group consisting of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

37. The hardmask composition according to claim 33, wherein the first polymer is present in an amount in a range of about 1 to about 50 parts by weight, based on the total weight of the composition.

38. The hardmask composition according to claim 33, wherein the second polymer is present in an amount in a range of about 1 to about 30 parts by weight, based on the total weight of the composition.

39. The hardmask composition according to claim 33, further comprising one or more of a crosslinking agent and a surfactant.

40. A method for producing a semiconductor integrated circuit device, comprising the steps of:

(a) providing a material layer on a substrate;
(b) forming a hardmask layer on the material layer wherein the hardmask layer is composed of an organic material;
(c) forming an antireflective hardmask layer using the hardmask composition according to claim 1 for a resist underlayer film on the material layer;
(d) forming a radiation-sensitive imaging layer on the antireflective hardmask layer;
(e) patternwise exposing the imaging layer to radiation to form a pattern of radiation-exposed regions in the imaging layer;
(f) selectively removing portions of the radiation-sensitive imaging layer and the antireflective hardmask layer to expose portions of the hardmask material layer containing an organic material;
(g) selectively removing portions of the patterned antireflective hardmask layer and the hardmask material layer containing an organic material to expose portions of the material layer; and
(h) etching the exposed portions of the material layer to form a patterned material layer.

41. A semiconductor integrated circuit device produced by the method according to claim 40.

42. A method for producing a semiconductor integrated circuit device, comprising the steps of:

(a) providing a material layer on a substrate;
(b) forming a hardmask layer on the material layer wherein the hardmask layer is composed of an organic material;
(c) forming an antireflective hardmask layer using the hardmask composition according to claim 9 for a resist underlayer film on the material layer;
(d) forming a radiation-sensitive imaging layer on the antireflective hardmask layer;
(e) patternwise exposing the imaging layer to radiation to form a pattern of radiation-exposed regions in the imaging layer;
(f) selectively removing portions of the radiation-sensitive imaging layer and the antireflective hardmask layer to expose portions of the hardmask material layer containing an organic material;
(g) selectively removing portions of the patterned antireflective hardmask layer and the hardmask material layer containing an organic material to expose portions of the material layer; and
(h) etching the exposed portions of the material layer to form a patterned material layer.

43. A semiconductor integrated circuit device produced by the method according to claim 42.

44. A method for producing a semiconductor integrated circuit device, comprising the steps of:

(a) providing a material layer on a substrate;
(b) forming a hardmask layer on the material layer wherein the hardmask layer is composed of an organic material;
(c) forming an antireflective hardmask layer using the hardmask composition according to claim 17 for a resist underlayer film on the material layer;
(d) forming a radiation-sensitive imaging layer on the antireflective hardmask layer;
(e) patternwise exposing the imaging layer to radiation to form a pattern of radiation-exposed regions in the imaging layer;
(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

45. A semiconductor integrated circuit device produced by the method according to claim 44.

46. A method for producing a semiconductor integrated circuit device, comprising the steps of:

(a) providing a material layer on a substrate;

(b) forming a hardmask layer on the material layer wherein the hardmask layer is composed of an organic material;

(c) forming an antireflective hardmask layer using the hardmask composition according to claim 25 for a resist underlayer film on the material layer, (d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

47. A semiconductor integrated circuit device produced by the method according to claim 46.

48. A method for producing a semiconductor integrated circuit device, comprising the steps of:

(a) providing a material layer on a substrate;

(b) forming a hardmask layer on the material layer wherein the hardmask layer is composed of an organic material;

(c) forming an antireflective hardmask layer using the hardmask composition according to claim 33 for a resist underlayer film on the material layer;

(d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

49. A semiconductor integrated circuit device produced by the method according to claim 48.

* * * * *